United States Patent [19]
Metabi

[11] 4,344,688
[45] Aug. 17, 1982

[54] INTERCHANGEABLE LENS ASSEMBLY
[75] Inventor: Tsuneyo Metabi, Sakai, Japan
[73] Assignee: Minolta Camera Kabushiki Kaisha, Osaka, Japan
[21] Appl. No.: 131,343
[22] Filed: Mar. 18, 1980

Related U.S. Application Data

[63] Continuation of Ser. No. 5,747, Jan. 23, 1979, abandoned.

[30] Foreign Application Priority Data

Jan. 31, 1978 [JP] Japan .................................. 53-9782

[51] Int. Cl.³ .......................... G03B 9/07; G03B 17/00
[52] U.S. Cl. ...................................... 354/272; 354/286
[58] Field of Search ............... 354/156, 232, 233, 270, 354/272, 286

[56] References Cited

U.S. PATENT DOCUMENTS 3,165,997 1/1965 Sugano et al. ....................... 354/232
4,081,811 3/1978 Baab et al. ........................... 354/272

Primary Examiner—L. T. Hix
Assistant Examiner—Thomas H. Tarcza
Attorney, Agent, or Firm—Wolder, Gross & Yavner

[57] ABSTRACT

An interchangeable lens of the automatic present diaphragm aperture type for a single lens reflex camera includes a swingable actuating lever spring biased to an advanced position and retracted and released by a control member retracted and advanced by the camera mechanism respectively with the termination of the exposure and the initiation of an exposure. A diaphragm blade control ring is spring biased to fully open aperture position and is unidirectionally drive coupled to the actuating lever by a rod projecting from the ring into the path of movement of a projection on the actuating lever so as to follow the lever under the influence of the biasing spring and to disengage the projection upon the diaphragm reaching its fully open position thereby permitting further retraction of the actuating lever and so as to be engaged and positively advanced by the projection with the advance of the lever.

12 Claims, 5 Drawing Figures

INTERCHANGEABLE LENS ASSEMBLY

This is a continuation of application Ser. No. 5,747 filed Jan. 23, 1979, now abandoned.

BACKGROUND OF THE INVENTION

The present invention relates generally to improvements in adjustable aperture lens diaphragms and it relates particularly to an interchangeable objective lens with an improved automatic preset aperture diaphragm.

A prior art diaphragm mechanism of the subject type is disclosed in U.S. Pat. No. 3,165,997 issued on Jan. 19, 1965. While this prior art mechanism is highly satisfactory it possesses certain drawbacks. Although the aforesaid mechanism is described in detail in the above patent an explanation thereof will provide a better understanding of the improved mechanism.

Referring to FIGS. 1 and 3 of the present drawings which illustrate a prior art mechanism, a reciprocating lever 1 in a camera body (not shown) is displaced or advanced from an initial or retracted position in the direction of the arrow prior to the commencement of an exposure sequence and returns to its initial position in response to the completion of the exposure sequence. The reciprocating lever 1 is brought into contact with a follower or engaging piece 2 of an arcuate diaphragm actuating lever 3 which is pivoted about an axis 4 to the lens barrel or cylinder which can be detachably mounted to the camera body by means of a coupling portion 25a and which is biased by a spring 6 to rotate clockwise. An arcuate lever 5 overlapping lever 3 is provided at its middle portion with a stop pin 8 and proximate an end thereof with a fork or yoke portion 5a and is coaxially provided with axis 4 on diaphragm actuating lever 3. The levers 3 and 5 are intercoupled and embracingly energized by a spring 13; the other end portion 5b of the overlapping lever 5 proximate yoke 5a is brought into contact with a stop defining pin 7 secured to the diaphragm actuating lever 3. The stop pin 8 is brought into contact with a cam plate 9 secured to the diaphragm adjusting ring 17. Opposing the stationary side of diaphragm blades 20, is a diaphragm mounting or pushing ring 16 having holes 16a which rotatably receive respective pins from blades 21 and a diaphragm control rod or pin 11 is secured to the diaphragm driving ring 12 and actuates the diaphragm blades 20 and is engaged in the fork portion 5a of the overlapping lever 5. In this case, the diaphragm actuating pin 11 is of a sufficient length to prevent the pin 11 from disengaging fork portion 5a even when the helicoid 27 is extended for focusing.

In the above arrangement, when the camera shutter button (not shown) is depressed after the desired diaphragm value is preset by diaphragm adjusting ring 17, the reciprocating lever 1 moves in the direction of the arrow through the known related mechanisms prior to the commencement of the exposure. Thus, the diaphragm actuating lever 3, which has been held in its initial posiition along with the engaging member 2 by the reciprocating lever 1, turns counter-clockwise about the pivot 4 under the influence of the spring 6 to similarly push and turn the overlapping lever 5 which in turn moves the diaphragm control pin 11 registering with the recess of the fork portion 5a and the diaphragm driving ring 12 carrying the control pin 11. The diaphragm blades 20 have respective elongated slots engaged by pins secured to the ring 12 and are accordingly stopped down from a full open position, reducing the aperture 30 formed thereby, with the blades 20 pivoting about the pins 21 engaging holes 16a of the pushing ring 16. The stop pin 8 of the overlapping lever 5 is advanced to and abuts against the periphery of the cam plate 9 which has been located at a selectively preset or predetermined position. Thus, the lever 5 is prevented from advancing further than the cam plate preset position, whereby diaphragm blades 20 are stopped automatically as its aperture size reaches to the preset desired value.

The reciprocating lever 1 returns in a direction opposite to that of the arrow, pushing back the diaphragm actuating lever 3 against the influence of the spring 6, after completion of the exposure with the lever 1 abutting the engaging member 2. The overlapping lever 5, following the lever 3 under the influence of spring 13, returns to its initial position. Thus, the diaphragm driving ring 12 causes the diaphragm blades 20 to return to its original fully open position through the diaphragm control pin 11 engaged by the fork portion 5a. A stop 12a is provided on the diaphragm opening ring 12 in order to prevent further rotation thereof from its fully open position.

The reciprocating lever 1 will somewhat further advance in the direction opposite to that of the arrow in order to return to its initial position and to bias the diaphragm aperture to the completely fully open condition. More particularly, the reciprocating lever 1 is further somewhat moved in the reverse direction to that of the arrow after the diaphragm aperture 30 reaches its fully open condition whereby the actuating lever 3 further rotates in a counterclockwise direction against the influence of the spring 6. The overlapping lever 5 tends to follow the actuating lever 3 under the action of spring 13 so as to further rotate the diaphragm driving ring 12 in counterclockwise direction beyond its fully open position, but such further movement of the overlapping lever 5 and the driving ring 12 are prevented by the stop 12a provided on the ring 12 engaging an abutment. Therefore, only the actuating lever 3 is further rotated counterclockwise, disengaging the pin 7 from the end portion 5b of the overlapping lever 5 and charging the spring 13, thereby providing a gap between the end portion 5b and the pin 7. In this state, as the diaphragm driving ring 12 is continuously urged in a counterclockwise direction by the spring 13, the diaphragm aperture 30 is maintained in its fully open condition.

In order to ensure the fully opened condition of the diaphragm aperture 30 when the stop 12a abuts the abutment defining stationary portion of the lens barrel, the diaphragm pushing ring 16 is rotatable so that its relative angular position with respect to the diaphragm driving ring 12 may be adjusted. Practically, the adjustment for ensuring a fully opened aperture is carried out in a manner that the diaphragm pushing ring 16 is rotated with the ring 12 being kept at a position where the stop 12a engages the stationary abutment.

As the above described conventional mechanism is so constructed as that the diaphragm driving ring 12 is positively or forcibly rotated in a counterclockwise direction through the engagement of the fork portion 5a and the diaphragm control pin 11 when the diaphragm adjusting ring 17 carrying cam plate 9 is rotated toward a position to preset the fully open diaphragm aperture value, the following shortcomings or defects may occur.

When the diaphragm adjusting ring 17 is erroneously set to a position for fully opening the aperture, before the above-mentioned adjustment for ensuring fully open aperture condition is completed, the driving ring 12 is forcibly rotated beyond a position where the pin 19 engages the rear edge 20a of the next blade 20. Thus, the diaphragm blades 20 may be damaged or deformed.

Further, even if the adjustment for ensuring the fully open aperture has been completed, an undesirable force may be exerted to rotate the diaphragm driving ring 12 beyond a position where the stop 12a engages the stationary abutment portion.

The diaphragm adjusting ring 17 is, in general, restricted in its angular rotation to a predetermined amount by a stop 18 which is secured to the stationary portion of the lens barrel and engages a groove 24 formed in the inner wall of the ring 17, as shown in FIG. 5.

The groove 24 and the stop 18 are not necessarily formed or manufactured to the exact dimensions as designed, thus, errors likely occur in the extend and size of the groove and the stop. Further, upon assembly, the stop 18 may be secured with some positional error relative to the groove to the stationary portion of the lens barrel.

Accordingly, as seen in FIG. 5, the diaphragm adjusting ring 17 may be further rotated counterclockwise for an angle a beyond a predetermined limit, due to the accumulation of such errors. When the diaphragm adjusting ring 17 is further rotated beyond its desired limit, the cam plate 9 depresses the stop pin 8 to undesirably rotate the overlapping lever 5 counterclockwise. Thus, as explained above, an excessive force may be exerted on the diaphragm driving ring 12 to unnecessarily rotate it counterclockwise.

When such excessive force is exerted on the diaphragm driving ring 12, the ring 12 may be deformed or distorted since ring 12 is generally constructed as a thin member for quick movement. As a result, with the structure of the conventional mechanism, a smooth operation for opening and closing the diaphragm aperture is obstructed.

The conventional mechanism of the above nature requires a large number of parts in order to transmit the movement of the diaphragm adjusting ring 17 to the diaphragm control pin 11. For instance, the cam means including cam plate 9 and stop pin 8, the actuating lever 3, the overlapping lever 5, and the spring 17 for cooperatively urging the actuating lever 3 and overlapping lever 5 are required. Moreover, with the conventional structure, the diaphragm actuating lever 3, the overlapping lever 5 and the diaphragm control pin 11 must be associated in particular interfitting relationship with each other in order to achieve the proper transmitting function.

As a result, the number of parts and the complexity in construction of the mechanism are increased, and their assembly is highly time consuming.

SUMMARY OF THE INVENTION

It is a primary object of the present invention to provide an improved diaphragm mechanism.

It is another object of the present invention to provide an improved diaphragm mechanism of high reliability and great durability.

It is still another object of the present invention to provide an improved diaphragm mechanism of the automatic preset aperture type which does not transmit the rotational movement of the diaphragm adjusting ring to the diaphragm mechanism when the diaphragm adjusting ring is rotated beyond the position for fully opening the diaphragm aperture.

It is yet another object of the present invention to provide an improved diaphragm device of highly simple construction with a minimum number of parts.

In a mechanism according to the present invention, a spring directly biases the diaphragm drive ring and the diaphragm control pin connected thereto to a diaphragm fully open position and a single actuating lever is provided which is unidirectionally drive coupled to the control pin whereby when the lever is retracted the pin follows the lever under the influence of the spring to permit the lever to retract further than the control pin and disengage the latter and when the actuating lever advances, it directly engages and advances the control pin and diaphragm drive ring. The unidirectional coupling, in the preferred form, includes a projection located on the free end of the actuating lever and having an edge facing the direction of advance of the actuating lever and movable along a path to engage and advance the control pin. The control pin is free to move away from the projection and is biased by the spring to follow the projection, a stop being provided to limit the retraction of the drive ring and control pin at the diaphragm fully open aperture to a point at which the control pin is in advance of and spaced from the fully retracted position of the actuating lever projection.

The improved mechanism obviates the drawbacks of the conventional mechanism and is of rugged and simple construction, easy to fabricate and of high reliability.

DESCRIPTION OF THE PREFERRED EMBODIMENT

Figure 1:
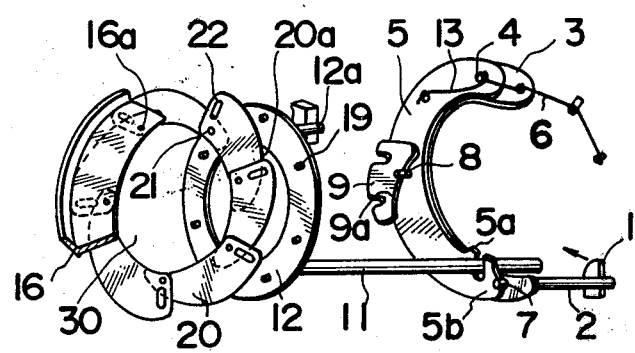
FIG. 1 is an exploded perspective view of a conventional mechanism of the nature of that of the present invention.
Figure 2:
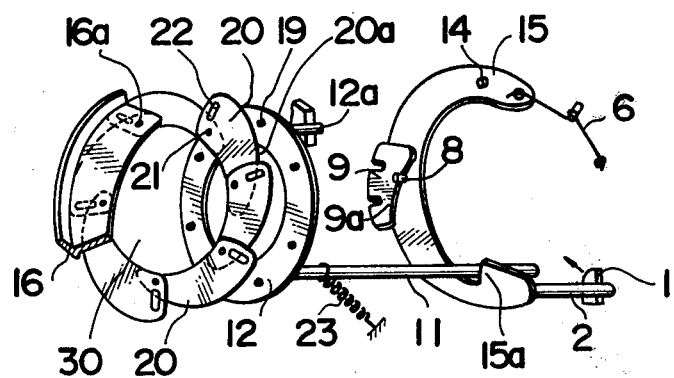
FIG. 2 is a view similar to FIG. 1 of a preferred embodiment of the present invention.
Figure 3:
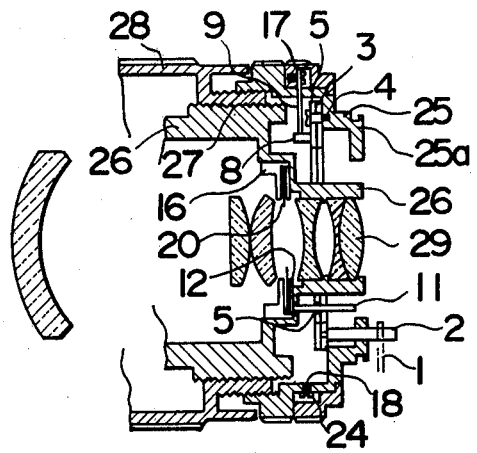
FIG. 3 is a fragmentary longitudinal sectional view of a lens barrel which incorporates the conventional mechanism of FIG. 1.
Figure 4:
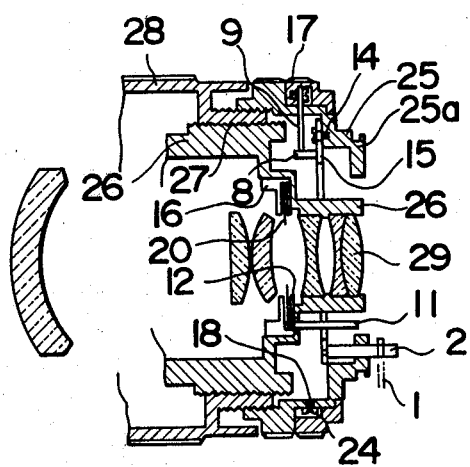
FIG. 4 is a view similar to FIG. 3 of a lens barrel which incorporates the mechanism of FIG. 2.
Figure 5:
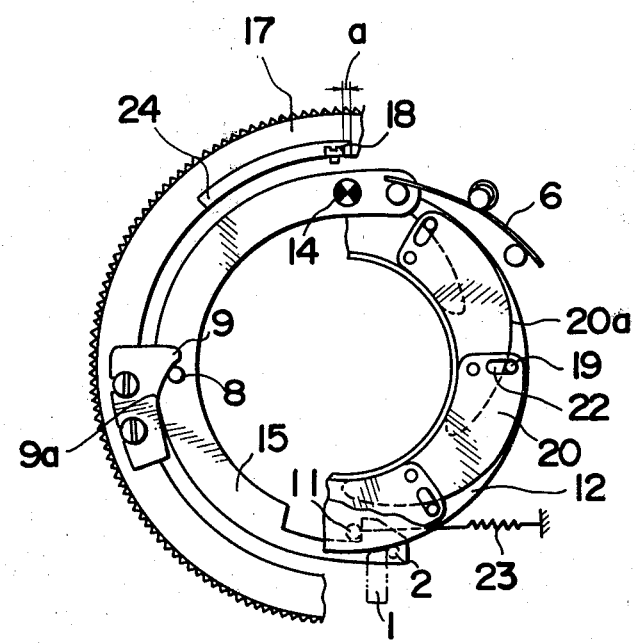
FIG. 5 is a fragmentary vront elevational view illustrating an essential part of the mechanism of the present invention.

Referring now to FIGS. 2, 4 and 5 which illustrate a preferred embodiment of the present invention, the members designated by the same reference numerals or symbols as those in FIGS. 1 and 3 and have substantially the same functions and structures as the corresponding members in FIGS. 1 and 3, and explanation of such members is omitted to simplify the detailed description.

The improved mechanism includes an arcuate diaphragm actuating lever 15 which is swingably pivoted by a pin 14 to a fixed cylinder or lens barrel section 25 which may be detachably mounted to a camera body (not shown) by means of the coupling or engaging portion 25a. The lever 15 is biased or urged by spring 6 to rotate clockwise from a cocked or retracted position to a released or advance position. An engaging member or follower 2 carried by the actuating lever 15 protrudes rearwardly from the fixed cylinder 25 of the lens body toward the camera body (not shown) and is urged or biased into engagement with the reciprocating lever 1 of the camera body mechanism under the influence of spring 6 when the lens assembly is mounted on the camera body. Thus, when the lens is mounted on the camera body, the diaphragm actuating lever 15 is brought to a cocked position by the reciprocating lever 1. The diaphragm actuating lever 15 rotates clockwise to follow the reciprocating lever 1 when the lever 1 is moved in the direction designated by the arrow. The diaphragm actuating lever 15 is provided with a tooth or hook shaped drive portion 15a which is unidirectionally drive coupled to control pin 11, that is only clockwise rotation of lever 15 drives pin 11 but counterclockwise rotation of lever 15 does not drive pin 11. The stop pin 8 is brought into contact with the cam surface 9a of the cam plate 9 with the clockwise rotation of lever 15. The cam plate 9 is secured to the diaphragm adjusting ring 17 so to rotate integrally therewith and is provided with cam surface 9a which is in the path of the stop pin 8 so as to restrict the rotation of the actuating lever 15 a predetermined amount to a selectively present position.

In the present embodiment, the diaphragm control pin 11 extending rearwardly from diaphragm ring 12 toward the diaphragm actuating lever 15 is urged or biased by a spring 23 counterclockwise i.e., in the direction to open the diaphragm aperture 30 through the diaphragm driving ring 12 and to bring the control pin 11 into unidirectional engagement with the drive portion 15a of the diaphragm actuating lever 15. Thus, the diaphragm control pin 11 carried by the diaphragm driving ring 12 is interlocked with the actuating lever 15 so that the control pin 11 is forcibly or positively driven or moved in a clockwise direction against the influence of spring 23 by being pushed by the drive portion 15a when the actuating lever 15 rotates clockwise, while the control pin 11 is not pushed or driven by the drive portion 15a but is moved in a counterclockwise direction under the action of the spring 23 when the actuating lever 15 rotates counterclockwise. In this embodiment, the spring 23 extends between the control pin 11 and the fixed cylinder 25, however, it may extend between the control pin 11 and the actuating lever 15 so long as it urges the control pin 11 to engage the drive portion 15a.

The diaphragm adjusting ring 17 fixedly provided with the cam plate 9 is fitted on the outer periphery so as to be externally accessible and manually rotatable and its rotation is restricted to a predetermined amount by the alternative engagement of the top 18 by the opposite ends of the annular groove 24 provided on the inner wall of the diaphragm adjusting ring 17.

As seen in FIGS. 3 and 4, a focus adjusting member 28 threadedly engages the fixed cylinder 25, and an inner cylinder 26 threadedly engages the focus adjusting member 28 by way of helicoid 27 and carries a focusing lens 29 and the diaphragm mechanism which includes the diaphragm pushing ring 16, the diaphragm blades 20 and the diaphragm driving ring 12, therein.

In the above arrangement, the reciprocating lever 1 is moved in a direction opposite to that of the arrow to return to its initial position after the completion of an exposure. FIG. 2 shows the condition of the reciprocating lever 1 in a position just before it reaches its initial position. In such condition, the diaphragm aperture 30 formed by the diaphragm blades 20 is fully opened.

When the reciprocating lever 1 is moved further in the retraction direction that is opposite to that of the arrow to return to its initial position, the actuating lever 15 is rotated counterclockwise against the influence of spring 6. Accordingly, the diaphragm control pin 11 also tends to rotate counterclockwise so as to follow the actuating lever 15 under the influence of the spring 23. However, such rotation of the control pin 11 is prevented by the engagement of the rear outer edge portions 20a of the diaphragm blades 20 with the pins 19 provided for the next diaphragm blade or by the engagement of the stop 12a carried by the diaphragm driving ring 12 with the stationary abutment portion. Thus, the drive portion 15a disengages from the diaphragm control pin 11 to provide a clearance or gap therebetween. In such condition, as the diaphragm driving ring 12 is continuously subjected to the force of the spring 23 to rotate the ring 12 in the counterclockwise direction, the fully opened condition of the diaphragm aperture 30 is ensured.

On the other hand, the diaphragm actuating lever 15 rotates clockwise under the action of the spring 6 until the stop pin 8 bears against the cam surface 9a of the cam plate 9 in order to stop down or reduce the aperture 30 at a predetermined opening value preset by the diaphragm adjusting ring 17, when the reciprocating lever 1 is moved in the direction of the arrow as seen in FIG. 2 in response to the commencement of an exposure sequence.

As seen in FIG. 5, when the diaphragm adjusting ring 17 is rotated counterclockwise, the stop pin 8 bears against the cam plate 9 earlier, thus the amount of the movement of the stop pin 8 is reduced and the amount of the stopping down of the aperture 10 is decreased. When the diaphragm adjusting ring 17 is set to the extreme position in its counterclockwise movement, the amount of movement of the stop pin 8 is minimal or negligible so that the diaphragm aperture 30 is set to a fully opened condition. Further rotation of the diaphragm adjusting ring 17 beyond such extreme counterclockwise position is, in general, prevented by the engagement of the stop 18 with the end face or portion of the annular groove 24. However, as explained earlier, such rotation may occur due to the accumulation of errors in manufacturing and assembling, and abrasion of the end portion of the annular groove 24 and the periphery of the stop 18, whereby the diaphragm adjusting ring 17 may be further rotated an angle a beyond the extreme counterclockwise position. Such further rotation of the diaphragm adjusting ring 17 causes unnecessary counterclockwise rotation of the diaphragm actuating lever 15 by way of the cam plate 9 and the stop pin 8. However, such unnecessary rotation of the diaphragm actuating lever 17 is not transmitted to the diaphragm control pin 11, since the diaphragm actuating lever 15 and the diaphragm control pin 11 are unidirectionally intercoupled, that is, they are drive engaged with each other in one direction only relative to each other specifically, when the actuating lever 15 is excessively rotated in a counterclockwise direction, the drive portion 15a of the diaphragm actuating lever 15 disengages from the diaphragm control pin 11 to provide a clearance therebetween since the diaphragm driving ring 12 to which the diaphragm control pin 11 is secured is prevented from rotating in a counterclockwise direction by the stop 12a (shown in FIG. 2) abutting the stationary portion. In this condition, the diaphragm driving ring 12 is subjected only to the urging force of the spring 23 but never to the force applied to rotate the actuating lever 15. Thus, the excessive or undesirable rotation of the diaphragm adjusting ring 17 and the diaphragm actuating lever 15 is absorbed at the lost motion or unidirectional drive coupling between the control pin 11 and the actuating lever 15 so as to cut off or uncouple the transmission of the rotation of ring 17 and lever 5 to the diaphragm mechanism.

According to the present invention, if the diaphragm adjusting ring 17 is unnecessarily or undesirably rotated in a direction for increasing the diaphragm aperture size, such rotation is not transmitted to the diaphragm mechanism, as explained above. Therefore, the diaphragm blades 20 and the diaphragm driving ring 12 are not obstructed or deformed, even if the diaphragm adjusting ring 17 is undesirably rotated upon adjusting the diaphragm mechanism or the diaphragm adjusting ring 17 is rotated beyond the predetermined amount of rotation after the adjustment for the diaphragm mechanism is completed.

Further, with the structure of the present invention, the overlapping lever 5 which is required in the conventional device can be omitted since a single member, the diaphragm actuating lever 15, is only required as a means for actuating the diaphragm mechanism. Accordingly, the mechanism of the present invention results in a decrease in the manufacturing cost and provides for an easy assembly in comparison with the conventional mechanism.

I claim:

1. In an interchangeable lens assembly detachably mountable to a camera body including reciprocating means which is displaced from an initial position prior to the commencement of an exposure and returns to the initial position upon the completion of the exposure, the combination comprising:

a diaphragm mechanism including a diaphragm drive ring for forming an adjustable diaphragm aperture;

a control member integrally connected to said diaphragm drive ring and defining therewith a diaphragm control unit for controlling the opening of said diaphragm aperture;

a first spring directly connected to and biasing said control unit in a direction to open said diaphragm aperture;

an actuating member movable between a cocked position and a released position for directly engaging and advancing said control member in a direction to close the diaphragm aperture when said actuating member is displaced to said released position and being drive uncoupled from said control member when said actuating member is moved back to said cocked position;

second biasing means for biasing said actuating member from said cocked to said released position;

interlocking means for drive intercoupling said actuating member with said reciprocating means when said interchangeable lens is mounted to the camera body whereby said actuating member is maintained in said cocked position when said reciprocating means is in its initial position and said actuating member is permitted to move toward said release position when said reciprocating means is displaced from its initial position; and means for adjustably limiting the amount of the movement of said actuating member.

2. A combination as set forth in claim 1, wherein said member consists of an arcuate actuating lever swingably pivotally supported at one end thereof and the other end is integrally provided with a drive portion separably engageable with and unidirectionally drive coupled to said control member.

3. A combination as set forth in claim 2, wherein said lens assembly includes a lens body, and said interlocking means includes an engaging member provided on said other end of said actuating lever, said engaging member projecting rearwardly from said lens body.

4. A combination as set forth in claim 2 further comprising an externally manually operable diaphragm adjusting ring, and wherein said actuating member movement limiting means includes cam means and engaging means engageable with said cam means, said cam means being interconnected to one of said actuating lever or said diaphragm adjusting ring and said engaging means being interconnected to the other of said lever or ring.

5. A combination as set forth in claim 4, wherein said cam means is interconnected to said diaphragm adjusting ring and said engaging means is provided on said actuating lever.

6. A camera interchangeable objective lens of the automatic preset aperture type for use with a camera having a drive element movable from a retracted to an advanced position attendant to the initiation of an exposure comprising:

a variable aperture diaphragm;

an aperture adjusting unit including a diaphragm adjusting ring and an adjusting member integrally connected to said adjusting ring;

a first spring directly connected to and biasing said adjusting unit to a retracted aperture fully open position;

an actuating member movable between retracted and advanced positions and releasably coupled to follow said drive element to move toward retracted and advance positions with the movement of said drive element toward retracted and advanced positions; and a unidirectional coupling member located on and movable with said actuating member releasably directly engaging said adjusting member to couple said adjusting member and said actuating member whereby to only advance said adjusting member and diaphragm ring in a direction to reduce said diaphragm aperture under the direct pressure of the advancing actuating member and to permit the free retraction of said diaphragm and adjusting member only under the influence of said first spring member with the retraction of said actuating member.

7. The objective lens of claim 6 comprising a first follower member connected to and movable with said actuating member and second spring member biasing said actuating means to a retracted position with said first follower member releasably engaging said drive element.

8. The objective lens of claim 7 wherein said actuating member includes a swingably mounted lever and said follower member comprises a rod projecting longitudinally from the free end of said lever into separable engagement with said drive element.

9. The objective lens of claim 8 wherein said coupling member comprises a projection located on said lever proximate its free end and having a first face facing the direction of retraction of said lever and a follower member movable with said adjusting member and releasably engaging said adjustment.

10. The objective lens of claim 9 comprising means restricting the retraction of said adjusting member to a point in advance of the fully retracted position of said first face to provide a gap between said adjusting member and said first face in the fully retracted positions thereof.

11. A camera interchangeable objective lens of the automatic preset aperture type for use with a camera having a drive element movable from a retracted to an advancing position attendant to the initiation of an exposure comprising:
- a variable aperture diaphragm;
- an aperture adjusting member connected to said diaphragm;
- a first follower rigidly affixed to said adjusting member and defining therewith an adjusting unit;
- a first spring directly connected to said adjusting unit and biasing said adjusting unit to an aperture open position;
- actuating means consisting of a unitary lever swingable between retracted and advanced positions and a second follower located on said lever and a second spring biasing said lever to urge said second follower to releasably engage and follow said drive element whereby said lever moves towards retracted and advanced positions with the movement of said drive element toward retracted and advanced positions; and
- unidirectional coupling means releasably coupling said first follower and said actuating means and including a projection affixed to said lever proximate its free end and concurrently movable therewith and having a first face facing the direction of advance of said lever and releasably directly abutting said first follower, said first follower being advanceable away from said projection first face, whereby said coupling means only permits the advancement of said first follower, adjusting member and diaphragm in a direction to reduce said aperture under the direct pressure of the advancing lever and permits the free retraction of said first follower adjusting member and diaphragm only under the influence of said first spring with the retraction on said lever.

12. In an interchangeable lens assembly which has a manually operable diaphragm setting member and is detachably mountable on a camera body including reciprocating means which is displaced from an initial position prior to the commencement of an exposure and returns to the initial position upon the completion of the exposure, the combination comprising:
- a diaphragm mechanism for forming an adjustable diaphragm aperture and including a diaphragm control ring;
- a control member integrally connected to said diaphragm control ring and defining therewith a diaphragm control unit;
- an actuating member angularly movable within a predetermined angle;
- a first spring directly biasing said actuating member toward a predetermined extreme position of the movement thereof;
- a unidirectionally engaging portion fixedly located on said actuating member so that it directly abuts said control member to move the same when said actuating member is moved toward the other extreme position from said predetermined extreme position and that it disengages from said control member when said actuating member is moved toward said predetermined extreme position;
- a second spring directly connected to said control member for biasing said control member in a direction to engage said unidirectionally engaging portion whereby said control member is also moved to follow said unidirectionally engaging portion when said actuating member is moved to said predetermined extreme position;
- interlocking means for drive intercoupling said actuating member with said reciprocating means when said interchangeable lens is mounted on the camera body whereby said actuating member is maintained in the other of extreme position when said reciprocating means is in its initial position and said actuating member is permitted to move toward said predetermined extreme position when said reciprocating means is displaced from its initial position; and
- means for adjustably limiting the amount of the movement of said actuating member from said predetermined extreme position, said means including a cam member and an engaging member one of which is provided on said actuating member and the other of which is interlocked with said diaphragm setting member.

* * * * *